(12) United States Patent
Lu

(10) Patent No.: US 11,031,361 B2
(45) Date of Patent: Jun. 8, 2021

(54) SEMICONDUCTOR BONDING STRUCTURE AND METHOD OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kahosiung (TW)

(*) Notice: Subject to any disclaimer, the term of this patent is extended or adjusted under 35 U.S.C. 154(b) by 27 days.

(21) Appl. No.: 16/528,347

(22) Filed: Jul. 31, 2019

(65) Prior Publication Data

US 2021/0035933 A1    Feb. 4, 2021

(51) Int. Cl.
| | | |
|---|---|---|
| *H01L 23/00* | (2006.01) | |
| *H01L 25/065* | (2006.01) | |
| *H01L 25/00* | (2006.01) | |
| *H01L 21/48* | (2006.01) | |
| *H01L 23/31* | (2006.01) | |
| *H01L 23/498* | (2006.01) | |

(52) U.S. Cl.
CPC .......... *H01L 24/05* (2013.01); *H01L 21/4853* (2013.01); *H01L 23/3128* (2013.01); *H01L 23/49816* (2013.01); *H01L 24/03* (2013.01); *H01L 24/06* (2013.01); *H01L 24/08* (2013.01); *H01L 24/11* (2013.01); *H01L 24/13* (2013.01); *H01L 24/14* (2013.01); *H01L 24/89* (2013.01); *H01L 25/0657* (2013.01); *H01L 25/50* (2013.01); *H01L 23/49827* (2013.01); *H01L 2224/0401* (2013.01); *H01L 2224/05647* (2013.01); *H01L 2224/08146* (2013.01); *H01L 2224/08147* (2013.01); *H01L 2224/08235* (2013.01); *H01L 2224/08237* (2013.01); *H01L 2224/13023* (2013.01); *H01L 2224/13025* (2013.01); *H01L 2224/80895* (2013.01); *H01L 2224/80896* (2013.01); *H01L 2225/06524* (2013.01); *H01L 2225/06541* (2013.01); *H01L 2225/06568* (2013.01)

(58) Field of Classification Search
CPC ..... H01L 24/05; H01L 24/13; H01L 21/4853; H01L 23/3128; H01L 24/03; H01L 24/08; H01L 24/11; H01L 24/14; H01L 23/49816
See application file for complete search history.

(56) References Cited

U.S. PATENT DOCUMENTS

| | | | | |
|---|---|---|---|---|
| 2017/0373035 A1* | 12/2017 | Seol | .......... | H01L 25/18 |
| 2019/0371751 A1* | 12/2019 | Yu | .......... | H01L 24/03 |

* cited by examiner

*Primary Examiner* — Quoc D Hoang
(74) *Attorney, Agent, or Firm* — Foley & Lardner LLP

(57) ABSTRACT

A semiconductor structure and a method of manufacturing the same are provided. The semiconductor structure includes a first semiconductor element and a first bonding structure. The first semiconductor element has a first element top surface and a first element bottom surface opposite to the element top surface. The first bonding structure is disposed adjacent to the element top surface of the first semiconductor element and includes a first electrical connector, a first insulation layer surrounding the first electrical connector, and a first metal layer surrounding the first insulation layer.

16 Claims, 10 Drawing Sheets

SEMICONDUCTOR BONDING STRUCTURE AND METHOD OF MANUFACTURING THE SAME

BACKGROUND

1. Technical Field

The present disclosure relates to a semiconductor structure and a method of manufacturing the same and, more particularly, to a semiconductor structure including a bonding structure.

2. Description of the Related Art

There is a continuing demand to incorporate more than one semiconductor component into a single semiconductor package to reduce dimensions of the package. Because semiconductor components in a semiconductor package specify electrical connections to the external environment, such electrical connections and the process for making the same are important in determining whether the semiconductor components can function properly or can achieve specified performances and at the same time satisfy the miniaturization demand.

SUMMARY

In an aspect, a semiconductor structure includes a first semiconductor element and a first bonding structure. The first semiconductor element has a first element top surface and a first element bottom surface opposite to the first element top surface. The first bonding structure is disposed adjacent to the first element top surface of the first semiconductor element. The first bonding structure includes a first electrical connector, a first insulation layer surrounding the first electrical connector, and a first metal layer surrounding the first insulation layer.

In an aspect, a semiconductor structure includes a first semiconductor element and a first bonding structure. The first semiconductor element has a first element top surface and a first element bottom surface opposite to the first element top surface. The first bonding structure is disposed in the first semiconductor element. The first bonding structure includes a first electrical connector, a first insulation layer surrounding the first electrical connector, and a first metal layer surrounding the first insulation layer.

In an aspect, a method of manufacturing a semiconductor structure includes: providing a semiconductor element having an element top surface and an element bottom surface opposite to the element top surface, the semiconductor element including at least one first bonding pad disposed adjacent to the element top surface; disposing an outer insulation layer adjacent to the element top surface of the semiconductor element, wherein the outer insulation layer defines a first opening exposing a portion of the first bonding pad; disposing a metal layer in the first opening, wherein the metal layer defines a second opening; and disposing an inner insulation layer in the second opening, wherein the inner insulation layer defines a third opening; and disposing an electrical connector in the third opening.

BRIEF DESCRIPTION OF THE DRAWINGS

FIG. 9A, FIG. 9B, FIG. 9C, FIG. 9D, FIG. 9E, FIG. 9F, FIG. 9G, FIG. 9H, FIG. 9I, and FIG. 9J illustrate a method for manufacturing a semiconductor structure such as the semiconductor structure of FIG. 5.

FIG. 9A, FIG. 9B, FIG. 9C, FIG. 9D, FIG. 9E, FIG. 9F, FIG. 9G, FIG. 9H, FIG. 9I, FIG. 9J, and FIG. 9K illustrate a method for manufacturing a semiconductor device such as the semiconductor device of FIG. 6

DETAILED DESCRIPTION

Spatial descriptions, such as "above," "top," and "bottom" and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

In some embodiments, the present disclosure provides for an improved semiconductor bonding structure that can allow a semiconductor element to accommodate more interconnections, while the semiconductor element can function properly or can achieve the specified performances and at the same time satisfy the miniaturization demand.

Figure 1:
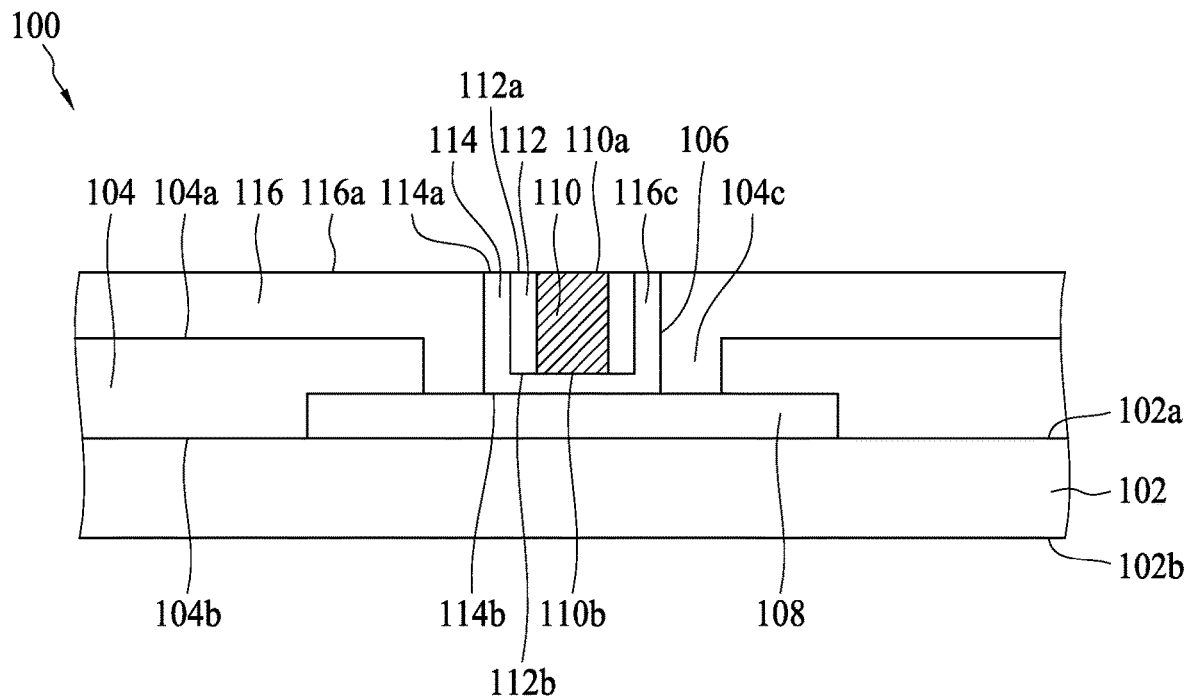
FIG. 1 illustrates a cross-sectional view of a semiconductor structure according to an embodiment of the present disclosure.

FIG. 1 illustrates a cross-sectional view of a semiconductor structure 100 according to an embodiment of the present disclosure. The semiconductor structure 100 of FIG. 1 includes a first semiconductor element 102, a first protective layer 104, and a first bonding structure 106.

The first semiconductor element 102 may be a die, a chip, a package, or an interposer. The first semiconductor element 102 has a first element top surface 102a, a first element bottom surface 102b opposite to the first element top surface 102a, and at least one first bonding pad 108. The first bonding pad 108 is disposed adjacent to the first element top surface 102a of the first semiconductor element 102. The first bonding pad 108 may be, for example, a contact pad of a trace. In the embodiment of FIG. 1, the first element top surface 102a is an active surface, the first bonding pad 108 is a contact pad, and the first bonding pad 108 is disposed directly on the first element top surface 102a of the first semiconductor element 102. The first bonding pad 108 may include, for example, one of, or a combination of, copper, gold, indium, tin, silver, palladium, osmium, iridium, ruthenium, titanium, magnesium, aluminum, cobalt, nickel, or zinc, or other metals or metal alloys.

The first protective layer 104 is disposed adjacent to the first element top surface 102a of the first semiconductor element 102. The first protective layer 104 has a first protective top surface 104a and a first protective bottom surface 104b opposite to the first protective top surface 104a. In some embodiments, such as the one illustrated in FIG. 1, the first protective layer 104 is disposed on the first element top surface 102a of the first semiconductor element 102. The first protective layer 104 defines at least one first opening 104c. Each first opening 104c may correspond to a respective first bonding pad 108 and exposes a portion of the first bonding pad 108. In some embodiments, the first protective layer 104 covers a portion of the first bonding pad 108 and covers a portion of the first element top surface 102a of the first semiconductor element 102. The first protective layer 104 may include polyimide or other suitable materials (e.g., photosensitive polymeric materials). The first protective layer 104 may be a passivation layer or an insulation layer (the material of which may be silicon oxide or silicon nitride, or another insulation material).

The first bonding structure 106 is disposed adjacent to the first element top surface 102a of the semiconductor element 102. In some embodiments, the first bonding structure 106 is disposed adjacent to the first bonding pad 108 of the first semiconductor element 102. In some embodiments, the first bonding structure 106 electrically connects to the first bonding pad 108 of the first semiconductor element 102. In some embodiments, the first bonding structure 106 is disposed in the first opening 104c defined by the first protective layer 104. The first bonding structure 106 may include a first electrical connector 110, a first insulation layer 112, and a first metal layer 114.

The first electrical connector 110 is disposed adjacent to the first element top surface 102a of the first semiconductor element 102. The first electrical connector 110 has a first connector top surface 110a and a first connector bottom surface 110b opposite to the first connector top surface 110a. In some embodiments, the first electrical connector 110 is disposed adjacent to the first bonding pad 108 of the first semiconductor element 102. In some embodiments, the first electrical connector 110 is disposed within the first opening 104c defined by the first protective layer 104. In some embodiments, the first electrical connector 110 is disposed above the first bonding pad 108 of the first semiconductor element 102. The first electrical connector 110 may be a conductive pillar structure, for example, a copper pillar.

The first insulation layer 112 is disposed adjacent to the first element top surface 102a of the first semiconductor element 102. In some embodiments, the first insulation layer 112 is disposed adjacent to the first bonding pad 108 of the first semiconductor element 102. In some embodiments, the first insulation layer 112 is disposed within the first opening 104c defined by the first protective layer 104. In some embodiments, the first insulation layer 112 defines an opening to accommodate the first electrical connector 110. In some embodiments, the opening of the first insulation layer 112 defines the position and shape of the first electrical connector 110. In some embodiments, the opening of the first insulation layer 112 defines the position and the formation direction of the first electrical connection 110. For example, in some embodiments where the first insulation layer 112 defines the opening, the first electrical connector 110 may be selectively grown and formed from the surface of the first metal layer 114 exposed from the opening of the first insulation layer 112, which would form the first electrical connection from substantially the same direction, e.g., from the bottom of the opening of the first insulation layer 112.

Since the first electrical connector 110 may be formed by substantially the same direction, the first electrical connector 110 may possess a consistent lattice orientation, as far as a plating operation is concerned. The first electrical connector 110 could have more structural strength to survive the subsequent processes, such as the polishing or etching process because the first electrical connector 110 are formed with a more consistent lattice orientation, which would produce an unique material property that is resistant to certain preferred orientation etch, such as wet chemical etch. In some comparative embodiments where the first electrical connector 110 is formed with more than one lattice orientation with respect to a surface normal of the first bonding pad 108, voids are prone to be formed in the first electrical connector 110 and/or the bonding pad below the first electrical connector due to subsequent processes, such as the polishing or etching operations. For example, when a center portion of the first electrical connector 110 has a {111} lattice orientation parallel to the surface normal of the bonding pad 108, and a peripheral portion of the first electrical connector 110 has a lattice orientation other than {111} parallel to the surface normal of the bonding pad 108, wet chemical used in the polishing or etching operations may attack the peripheral portion more than it does to the center portion, if the {111} lattice orientation is the less preferred lattice orientation to be removed by such wet chemicals.

The first insulation layer 112 has a first insulation top surface 112a and a first insulation bottom surface 112b opposite to the first insulation top surface 112a. In some embodiments, the first insulation top surface 112a of the first insulation layer 112 is substantially coplanar with the first connector top surface 110a of the first electrical connector 110. The first insulation layer 112 may include an insulation material or other suitable material.

The first metal layer 114 is disposed adjacent to the first element top surface 102a of the first semiconductor element 102. In some embodiments, the first metal layer 114 is disposed adjacent to the first bonding pad 108 of the first semiconductor element 102. In some embodiments, the first metal layer 114 is disposed within the first opening 104c defined by the first protective layer 104. The first metal layer 114 may define an opening for accommodating the first insulation layer 112 and the first electrical connector 110. In some embodiments, the first metal layer 114 surrounds the first insulation layer 112. The first metal layer 114 may cover a portion of the first connector bottom surface 110b, a portion of the first insulation bottom surface 112b, or both. In some embodiments, such as the one illustrated in FIG. 1, the first metal layer 214 is disposed within the first opening 104c defined by the first protective layer 104 and surrounds the first insulation layer 112 and covers a portion of the first connector bottom surface 110b and a portion of the first insulation bottom surface 112b.

The first insulation layer 112 may define an opening and exposes a portion of the first metal layer 114. The first metal layer 114 has a first metal top surface 114a and a first metal bottom surface 114b opposite to the first metal top surface 114a. In some embodiments, the first metal top surface 114a of the first metal layer 114 is substantially coplanar with the first insulation top surface 112a of the first insulation layer 112. In some embodiments, the first metal top surface 114a of the first metal layer 114 is substantially coplanar with the first connector top surface 110a of the first electrical connector 110. In some embodiments, the first metal top surface 114a of the first metal layer 114 is substantially coplanar with the first insulation top surface 112a of the first insulation layer 112 and the first connector top surface 110a of the first electrical connector 110. The first metal layer 114 may be a metal seed layer.

By disposing the first metal layer 114 as having the first metal top surface 114a substantially coplanar with the first insulation top surface 112a of the first insulation layer 112, the bonding effect of the first bonding structure 106 can be improved as the first metal top surface 114a and the first insulation top surface 112a would constitute a hybrid bonding interface which could improve the bonding strength more than an interface composed of one kind of material. In addition, the first metal layer 114 may enhance the ability of the first electrical connector 110 to resist lateral stress occurred during the formation of the structure, such as, during the bonding annealing process as the first metal layer 114 typically has a higher coefficient of thermal expansion (CTE) than the first insulation layer 112 because of the difference in the materials.

A second insulation layer 116 may be further included between the first bonding structure 106 and the first protective layer 104 and disposed adjacent to the first element top surface 102a of the first semiconductor element 102. In some embodiments, the second insulation layer 116 is disposed adjacent to the first bonding pad 108. In some embodiments, the second insulation layer 116 is disposed within the first opening 104c defined by the protective layer 104. In some embodiments, the second insulation layer 116 is disposed on the protective layer 104 and defines a second opening 116c and exposes a portion of the first bonding pad 108. The second opening 116c of the second insulation layer 116 may accommodate the first metal layer 114, the first insulation layer 112, and the first electrical connector 110. In some embodiments, such as the one illustrated in FIG. 1, the second insulation layer 116 surrounds the first metal layer 114 and covers a portion of the first bonding pad 108.

The second insulation layer 116 has a second insulation top surface 116a and a second insulation bottom surface 116b opposite to the second insulation top surface 116a. In some embodiments, the second insulation top surface 116a of the second insulation layer 116 is substantially coplanar with the top surface of the first bonding structure 106. In some embodiments, the second insulation top surface 116a of the second insulation layer 116 is substantially coplanar with the first metal top surface 114a of the first metal layer 114. In some embodiments, the second insulation top surface 116a is substantially coplanar with the first insulation top surface 112a of the first insulation layer 112. In some embodiments, the second insulation top surface 116a is substantially coplanar with the first connector top surface 110a of the first electrical connector 110. In some embodiments, the second insulation top surface 116a of the second insulation layer 116 is substantially coplanar with the first metal top surface 114a, the first insulation top surface 112a, and the first connector top surface 110a.

By disposing the second insulation layer 116 as having a second insulation top surface 116a substantially coplanar with any layer of the first bonding structure 106, the bonding ability of the first bonding structure 106 can be further improved as the second insulation layer can provide good adhesion ability.

The second insulation bottom surface 116b of the second insulation layer 116 may be above the first protective top surface 104a of the first protective layer 104. The second insulation layer 116 and the protective layer 104 may be the same or different or formed integrally. The second insulation layer 116 may include an insulation material or other suitable material.

Figure 2:
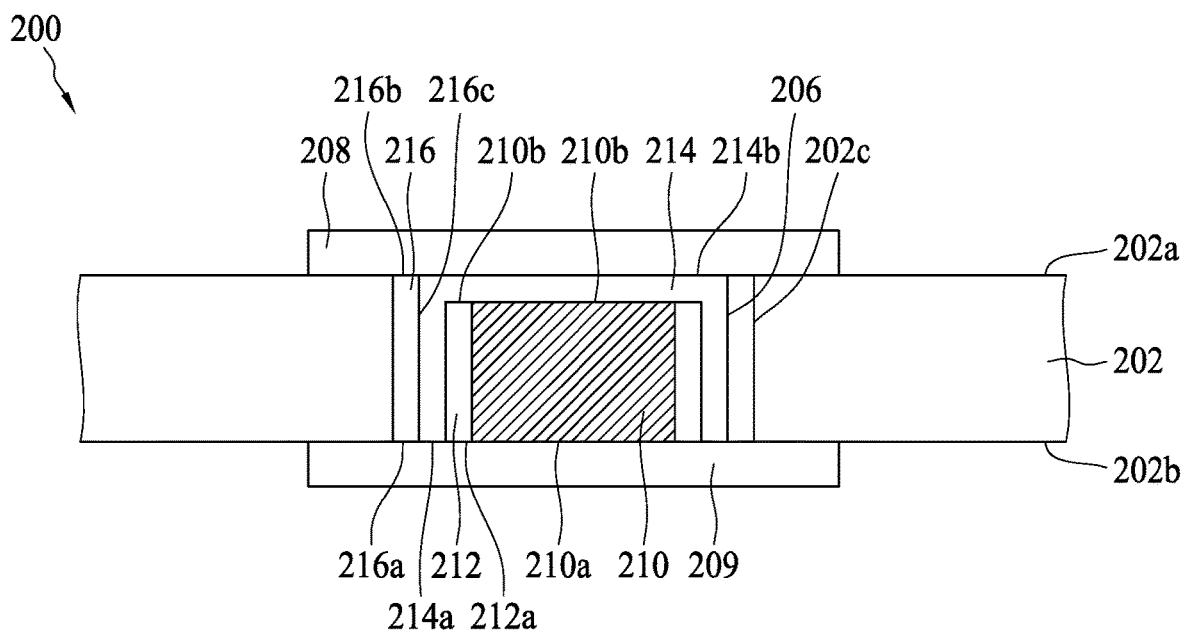
FIG. 2 illustrates a cross-sectional view of a semiconductor structure according to an embodiment of the present disclosure.

FIG. 2 illustrates a cross-sectional view of a semiconductor structure 200 according to an embodiment of the present disclosure. The semiconductor structure 200 of FIG. 2 includes a first semiconductor element 202 and a first bonding structure 206.

The first semiconductor element 202 may be a die, a chip, a package, or an interposer. The first semiconductor element 202 has a first element top surface 202a, a first element bottom surface 202b opposite to the first element top surface 202a, at least one first bonding pad 208, and at least one second bonding pad 209.

The first bonding pad 208 is disposed adjacent to the first element top surface 202a of the first semiconductor element 202. The first bonding pad 208 may be, for example, a contact pad of a trace. In the embodiment of FIG. 2, the first bonding pad 208 is disposed directly on the first element top surface 202a of the first semiconductor element 202. The first bonding pad 208 may include, for example, one of, or a combination of, copper, gold, indium, tin, silver, palladium, osmium, iridium, ruthenium, titanium, magnesium, aluminum, cobalt, nickel, or zinc, or other metals or metal alloys.

The second bonding pad 209 is disposed adjacent to the first element bottom surface 202b of the first semiconductor element 202. The second bonding pad 209 may be, for example, a contact pad of a trace. In the embodiment of FIG. 2, the second bonding pad 209 is disposed directly on the first element bottom surface 202b of the first semiconductor element 202. The second bonding pad 209 may include, for example, one of, or a combination of, copper, gold, indium, tin, silver, palladium, osmium, iridium, ruthenium, titanium, magnesium, aluminum, cobalt, nickel, or zinc, or other metals or metal alloys.

The first bonding structure 206 is disposed in the first semiconductor element 202. In some embodiments, the first semiconductor element 202 has at least one first through opening 202c and the first bonding structure 206 is disposed in the first through opening 202c. In some embodiments, the first bonding structure 206 extends from the first element top surface 202a of the first semiconductor element 202 to the first element bottom surface 202b thereof. The first bonding structure 206 may electrically connect to the first bonding bad 208, the second bonding pad 209, or both. In some embodiments, the first bonding structure 206 contacts the first bonding bad 208 and the second bonding pad 209. In some embodiments, such as the one illustrated in FIG. 2, the first bonding structure 206 electrically connects to the first bonding bad 208 and the second bonding pad 209 so that an electrical signal can be transmitted from one side of the first semiconductor element 202 to the other side. The first bonding structure 206 may include a first electrical connector 210, a first insulation layer 212, and a first metal layer 214. In some embodiments, the first semiconductor element 202 may be a semiconductor substrate and the first through opening 202c may include a through substrate conductive via.

The first electrical connector 210 is disposed adjacent to the first element top surface 202a of the semiconductor element 202. In some embodiments, the first electrical connector 210 is disposed within first through opening 202c of the first semiconductor element 202. The first electrical connector 210 has a first connector top surface 210a and a first connector bottom surface 210b opposite to the first connector top surface 210a. In some embodiments, the first electrical connector 210 is disposed adjacent to the first bonding pad 208, the second bonding pad 209, or both. In some embodiments, the first electrical connector 210 electrically connects to the first bonding pad 208, the second bonding pad 209, or both. In some embodiments, such as the one illustrated in FIG. 2, the first electrical connector 210 electrically connects to the first bonding bad 208 and the second bonding pad 209. The first electrical connector 210 may be a conductive pillar structure, for example, a copper pillar.

The first insulation layer 212 is disposed adjacent to the first element top surface 202a of the first semiconductor element 202. In some embodiments, the first insulation layer 212 is disposed adjacent to the first bonding pad 208 of the first semiconductor element 202. In some embodiments, the first insulation layer 212 is disposed within the first through opening 202c of the first semiconductor element 202. In some embodiments, the first insulation layer 212 defines an opening to accommodate the first electrical connector 210. The position and shape of the first electrical connector 210 are determined by the opening defined by the first insulation layer 212. In some embodiments, the first insulation layer 212 surrounds the first electrical connector 210. As described above, by surrounding the first electrical connector 210 with a first insulation layer 212, voids caused by the subsequent processes, such as the polishing or etching process, in the first electrical connector 210 or the bonding pad below could be reduced, which improves the reliability of the semiconductor element.

The first insulation layer 212 has a first insulation top surface 212a and a first insulation bottom surface 212b opposite to the first insulation top surface 212a. In some embodiments, the first insulation top surface 212a of the first insulation layer 212 is substantially coplanar with the first connector top surface 210a of the first electrical connector 210. The first insulation layer 212 may include an insulation material or other suitable material.

The first metal layer 214 is disposed adjacent to the first element top surface 202a of the first semiconductor element 202. In some embodiments, the first metal layer 214 is disposed adjacent to the first bonding pad 208 of the first semiconductor element 202. In some embodiments, the first metal layer 214 is disposed within the first through opening 202c of the first semiconductor element 202. The first metal layer 114 may define an opening for accommodating the first insulation layer 212 and the first electrical connector 210. In some embodiments, the first metal layer 214 surrounds the first insulation layer 212. The first metal layer 214 may cover a portion of the first connector bottom surface 210b, a portion of the first insulation bottom surface 212b, or both. In some embodiments, such as the one illustrated in FIG. 2, the first metal layer 214 is disposed within the first through opening 202c of the first semiconductor element 202 and surrounds the first insulation layer 212 and covers a portion of the first connector bottom surface 210b and a portion of the first insulation bottom surface 212b. In some embodiments, the first metal layer 214 electrically connects to the first bonding pad 208, the second bonding pad 209, or both. In some embodiments, such as the one illustrated in FIG. 2, the first metal layer 214 contacts to the first bonding bad 208 and the second bonding pad 209. The consistent lattice orientation of the first electrical connector 110 discussed previously in addressing FIG. 1 may also appear in the first electrical connector 210 of the semiconductor structure 200.

The first metal layer 214 has a first metal top surface 214a and a first metal bottom surface 214b opposite to the first metal top surface 214a. In some embodiments, the first metal top surface 214a of the first metal layer 214 is substantially coplanar with the first insulation top surface 212a of the first insulation layer 212. In some embodiments, the first metal top surface 214a of the first metal layer 214 is substantially coplanar with the first connector top surface 210a of the first electrical connector 210. In some embodiments, the first metal top surface 214a of the first metal layer 214 is substantially coplanar with the first insulation top surface 212a of the first insulation layer 212 and the first connector top surface 210a of the first electrical connector 210. The first metal layer 214 may a metal seed layer.

As described above, by disposing the first metal layer 214 as having a first metal top surface 214a substantially coplanar with the first insulation top surface 212a of the first insulation layer 212, the bonding effect of the first bonding structure 206 can be improved.

A second insulation layer 216 may be further included within the first through opening 202c of the first semiconductor element 202 and surrounds the first bonding structure 206. In some embodiments, the second insulation layer 216 is disposed in conformity with the side wall of the first through opening 202c of the first semiconductor element 202. In some embodiments, the second insulation layer 216 is disposed adjacent to the first bonding pad 208, the second bonding pad 209, or both. In some embodiments, the second insulation layer 216 is disposed within the first through opening 202c of the first semiconductor element 202 and defines a second through opening 216c, which accommodates the first bonding structure 206.

The second insulation layer 216 has a second insulation top surface 216a and a second insulation bottom surface 216b opposite to the second insulation top surface 216a. In some embodiments, the second insulation top surface 216a of the second insulation layer 216 is substantially coplanar with the top surface of the first bonding structure 206. In some embodiments, the second insulation top surface 216a of the second insulation layer 216 is substantially coplanar with the first metal top surface 214a of the first metal layer 214. In some embodiments, the second insulation top surface 216a is substantially coplanar with the first insulation top surface 212a of the first insulation layer 212. In some embodiments, the second insulation top surface 216a is substantially coplanar with the first connector top surface 210a of the first electrical connector 210. In some embodiments, the second insulation top surface 216a of the second insulation layer 216 is substantially coplanar with the first metal top surface 214a, the first insulation top surface 212a, and the first connector top surface 210a. In some embodiments, the second insulation bottom surface 216b of the second insulation layer 216 is substantially coplanar with the first metal bottom surface 214a of the first metal layer 214, the first element top surface 202a of the first semiconductor element 202, or both. The second insulation layer 216 may include an insulation material or other suitable material.

As described above, by disposing the second insulation layer 216 as having a second insulation top surface 216a substantially coplanar with any layer of the first bonding structure 206, the bonding ability of the first bonding structure 206 can be further improved.

Figure 3:
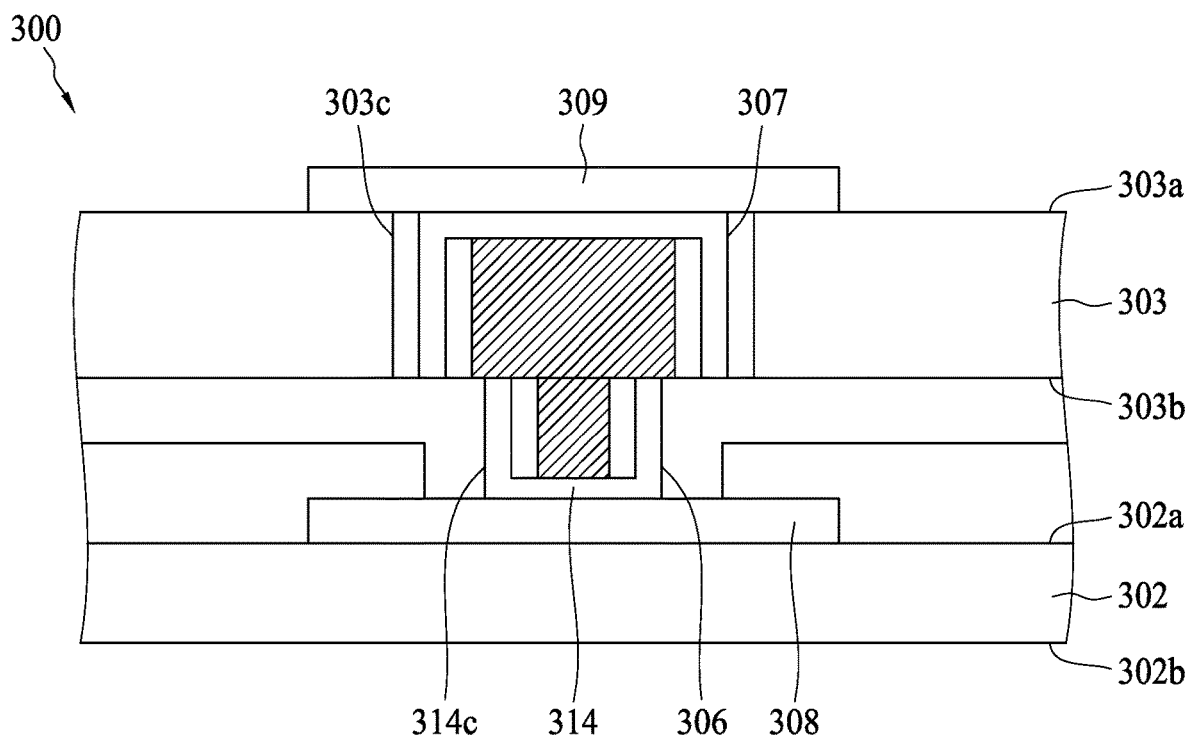
FIG. 3 illustrates a cross-sectional view of a semiconductor structure according to an embodiment of the present disclosure.

FIG. 3 illustrates a cross-sectional view of a semiconductor structure 300 according to an embodiment of the present disclosure. The semiconductor structure 300 of FIG. 3 includes a first semiconductor element 302, a first bonding structure 306, a second semiconductor element 303, and a second bonding structure 307.

The first semiconductor element 302 may be a die, a chip, a package, or an interposer. The first semiconductor element 302 has a first element top surface 302a, a first element bottom surface 302b opposite to the first element top surface 302a, and at least one first bonding pad 308.

The first bonding structure 306 is similar to that illustrated in FIG. 1 and disposed adjacent to the first bonding pad 308 of the first semiconductor element 302. In some embodiments, the first bonding structure 306 electrically connects to the first bonding pad 308 of the first semiconductor element 302.

The second semiconductor element 303 may be a die, a chip, a package, or an interposer. The second semiconductor element 303 has a second element top surface 303a, a second element bottom surface 303b opposite to the second element top surface 303a, and at least one second bonding pad 309.

The second bonding structure 307 is similar to that illustrated in FIG. 2 and disposed in the second semiconductor element 303. In some embodiments, the second semiconductor element 303 has at least one first through opening 303c and the second bonding structure 307 is disposed in the first through opening 303c. In some embodiments, the second bonding structure 307 electrically connects to the second bonding pad 309. In some embodiments, the second bonding structure 307 electrically connects to the first bonding structure 306. In some embodiments, the second bonding structure 307 electrically connects to the second bonding pad 309 and the first bonding structure 306.

In some embodiments, the first metal layer 314 of the first bonding structure 306 has a side surface 314c under a projection area of the second electrical connector 310 of the second bonding structure 307.

In some embodiments, such as the one illustrated in FIG. 3, the first semiconductor element 302 may electrically connect to the second semiconductor element 303 by electrically connecting the first bonding structure 306 to the second bonding structure 307 to constitute an element on element device or package (e.g., a chip on chip device or package). Such multiple-elements device or package may electrically connect to the external environment through the second bonding pad 309.

Figure 4:
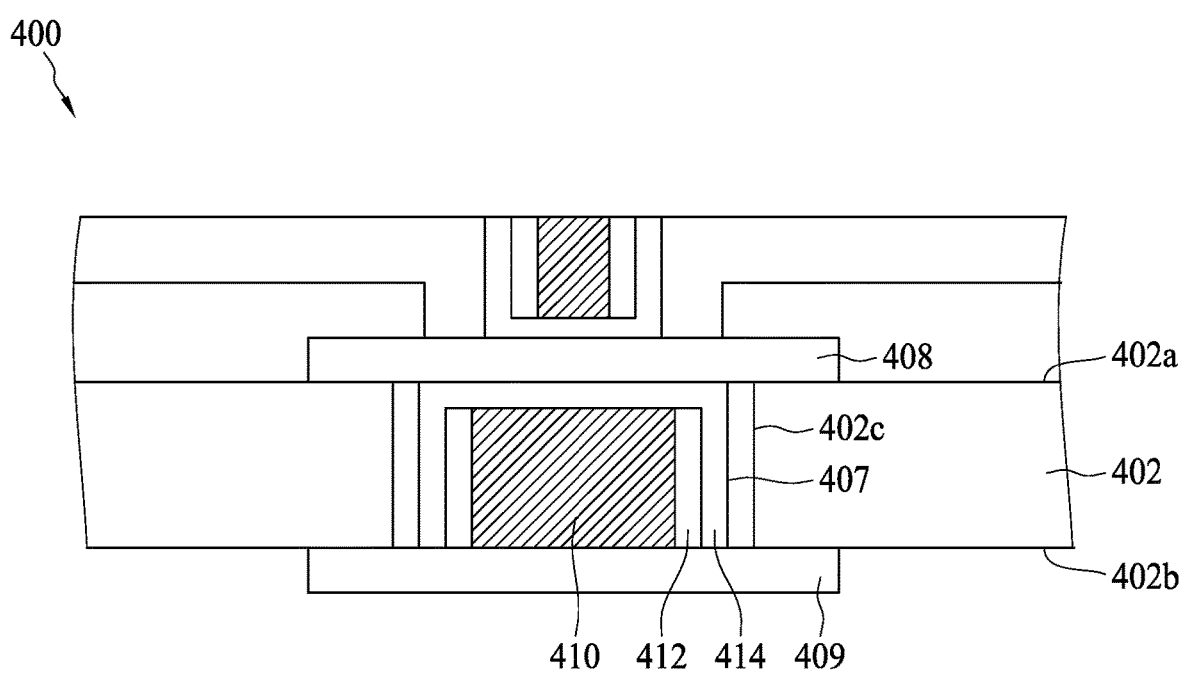
FIG. 4 illustrates a cross-sectional view of a semiconductor structure according to an embodiment of the present disclosure.

FIG. 4 illustrates a cross-sectional view of a semiconductor structure 400 according to an embodiment of the present disclosure. The semiconductor structure 400 is similar to that illustrated in FIG. 1, with a difference including that a second bonding structure 407 is disposed in the first semiconductor element 402 and a second bonding pad 409 is disposed adjacent to the first element bottom surface 402b of the first semiconductor element 402. In some embodiments, the first semiconductor element 402 has at least one first through opening 402c and the second bonding structure 407 is disposed in the first through opening 402c. In some embodiments, the second bonding structure 407 extends from the first element top surface 402a of the first semiconductor element 402 to the first element bottom surface 402b thereof. The second bonding structure 407 may electrically connect to the first bonding pad 408, the second bonding pad 409, or both. In some embodiments, the second bonding structure 407 contacts the first bonding bad 408 and the second bonding pad 409. In some embodiments, such as the one illustrated in FIG. 4, the second bonding structure 407 electrically connects to the first bonding bad 408 and the second bonding pad 409 so that an electrical signal can be transmitted from the first bonding structure 407 to the second bonding pad 409 on the other side of the first semiconductor element 402. The second bonding structure 407 is similar to that illustrated in FIG. 2 and may include a second electrical connector 410, a second insulation layer 412, and a second metal layer 414.

Figure 5:
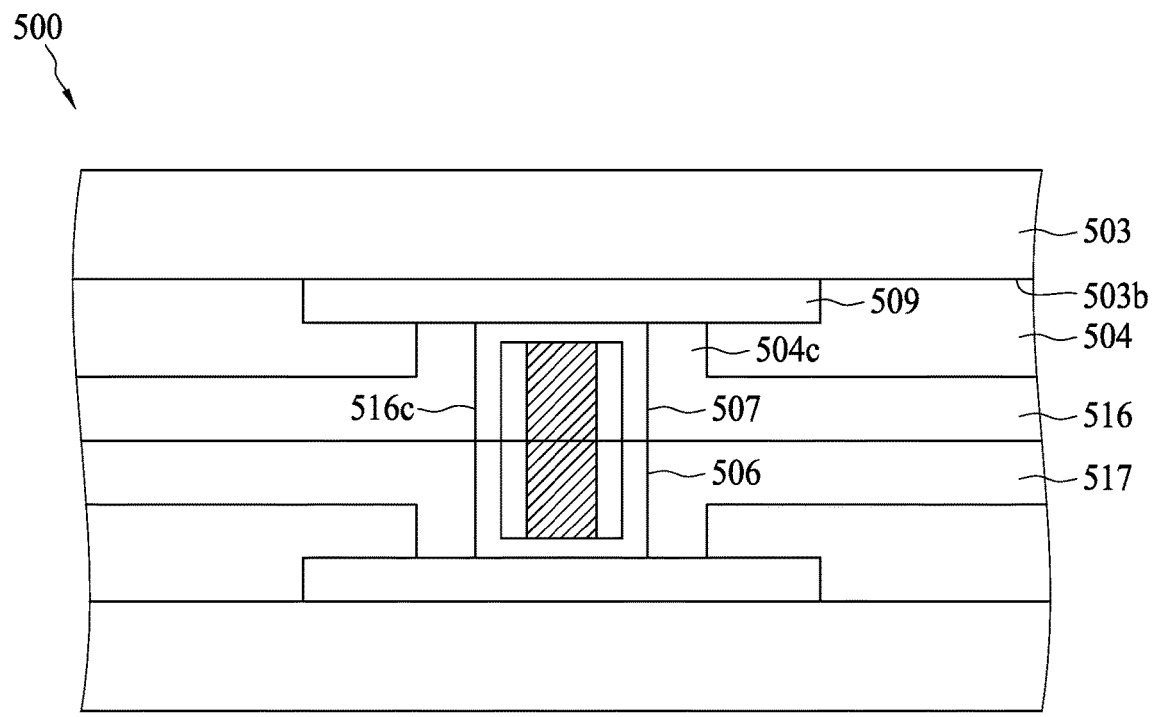
FIG. 5 illustrates a cross-sectional view of a semiconductor structure according to an embodiment of the present disclosure.

FIG. 5 illustrates a cross-sectional view of a semiconductor structure 500 according to an embodiment of the present disclosure. The semiconductor structure 500 is similar to that illustrated in FIG. 3, with a difference including that the second bonding structure 507 is disposed adjacent to the second element bottom surface 503b of the second semiconductor element 503, rather than in the second semiconductor element 503. In some embodiments, the second bonding structure 507 is disposed adjacent to the second bonding pad 509 of the second semiconductor element 503. In some embodiments, the second bonding structure 507 electrically connects to the first bonding structure 506. In some embodiments, the second bonding structure 507 electrically connects to the second bonding pad 509 of the second semiconductor element 503 and the first bonding structure 506.

A second protective layer 504 may be disposed adjacent to the second element bottom surface 503b of the second semiconductor element 503. In some embodiments, the first protective layer 504 defines at least one opening 504c and the second bonding structure 507 is disposed within the opening 504c. The second protective layer 504 may include polyimide or other suitable materials (e.g., photosensitive materials). The second protective layer 504 may be a passivation layer or an insulation layer (the material of which may be silicon oxide or silicon nitride, or another insulation material).

A fourth insulation layer 516 may be further included between the second bonding structure 507 and the second protective layer 504 and disposed adjacent to the second element bottom surface 503b of the second semiconductor element 503. In some embodiments, the fourth insulation layer 516 is disposed on the protective layer 504 and defines a second opening 516c. Each second opening 516c may correspond to a second bonding structure 507 and accommodate it. In some embodiments, such as the one illustrated in FIG. 5, the fourth insulation layer 516 surrounds the second bonding structure 507 and covers a portion of the second bonding pad 509. The fourth insulation layer 516 and the second protective layer 504 may be the same or different or formed integrally.

The fourth insulation layer 516 is disposed adjacent to the second insulation layer 517. In some embodiments, the fourth insulation layer 516 contacts the second insulation layer 517. The fourth insulation layer 516 and the second insulation layer 517 may include the same or different materials. In some embodiments, the fourth insulation layer 516 and the second insulation layer 517 have substantially the same materials, which may allow them to bond to each other easily.

Figure 6:
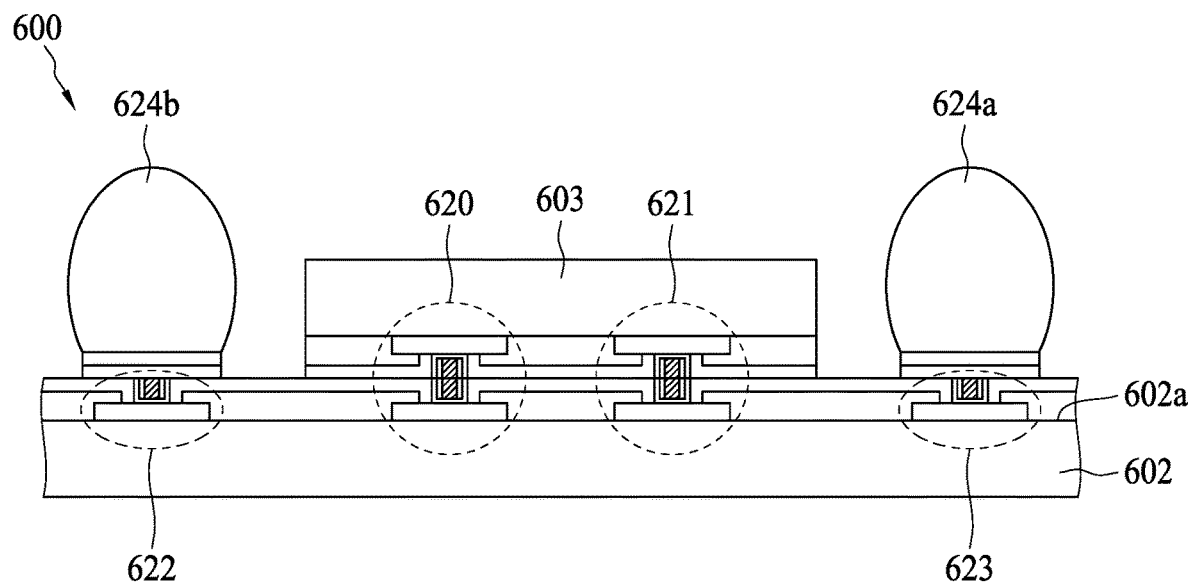
FIG. 6 illustrates a cross-sectional view of a semiconductor device according to an embodiment of the present disclosure.

FIG. 6 illustrates a cross-sectional view of a semiconductor device 600 according to an embodiment of the present disclosure. The semiconductor device 600 of FIG. 6 includes a first semiconductor element 602, a second semiconductor element 603, a first bonding structure 620, a second bonding structure 621, a third bonding structure 622, a fourth bonding structure 623, and at least one bump 624a, 624b.

The first semiconductor element 602 and the second semiconductor element 603 may independently be a die, a chip, a package, or an interposer.

The bump 624a, 624b is disposed adjacent to the first element top surface 602a of the first semiconductor element 602. In some embodiments, the bumps 624a, 624b are disposed adjacent to the third bonding structure 622 and the fourth bonding structure 623, respectively. In some embodiments, the bumps 624a, 624b electrically connect to the third bonding structure 622 and the fourth bonding structure 623, respectively for external electrical connection. The bump 624a, 624b may be a pillar or a solder/stud bump.

In some embodiments, the first bonding structure 620 and the second bonding structure 621 are similar to that illustrated in FIG. 5. In some embodiments, the third bonding structure 622 and the fourth bonding structure 623 are similar to that illustrated in FIG. 1. In some embodiments, the first bonding structure 620 and the second bonding structure 621 electrically connects the second semiconductor element 603 to the first semiconductor element 602 so the first semiconductor element 602 may electrically connect to the second semiconductor element through the first bonding structure 620 and the second bonding structure 621. In some embodiments, the third bonding structure 622 and the fourth bonding structure 623 electrically connects to a bump 624 so the first semiconductor element 602 may electrically connect to another semiconductor element through the third bonding structure 622 and the fourth bonding structure 623. In some embodiments where the first bonding structure 620 and the second bonding structure 621 electrically connects the second semiconductor element 603 to the first semiconductor element 602 and the third bonding structure 622 and the fourth bonding structure 623 electrically connects to a bump 624, the second semiconductor element 603 may electrically connect to another semiconductor element through the first semiconductor element 602.

Figure 7:
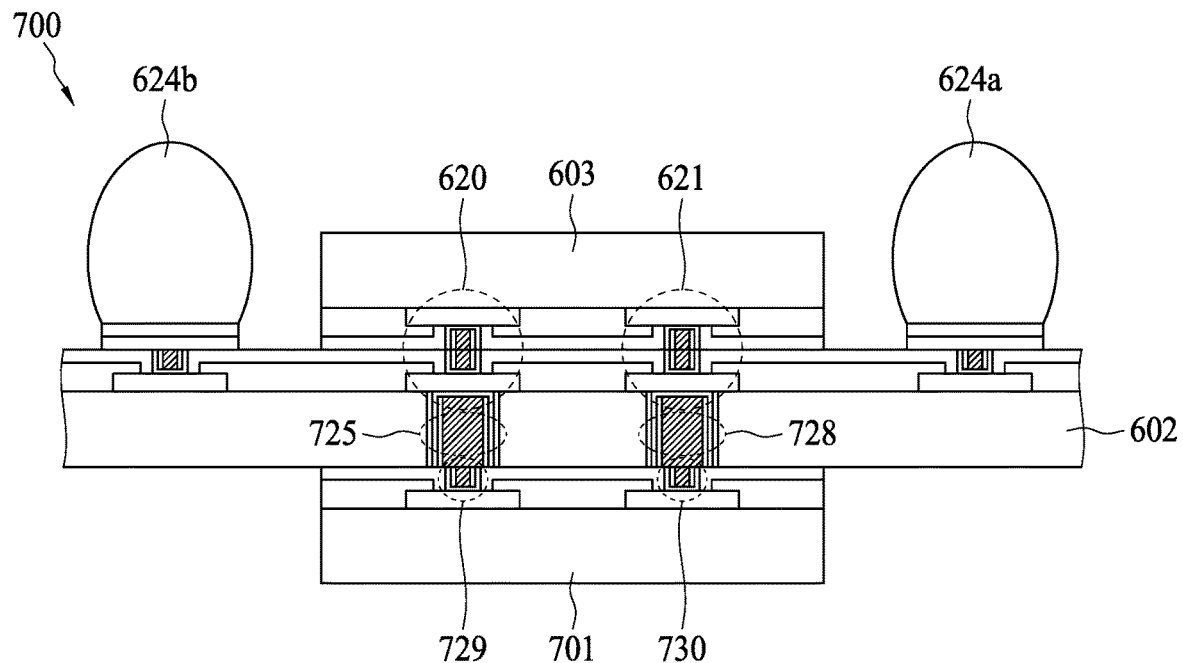
FIG. 7 illustrates a cross-sectional view of a semiconductor device according to an embodiment of the present disclosure.

FIG. 7 illustrates a cross-sectional view of a semiconductor device 700 according to an embodiment of the present disclosure. The semiconductor device 700 of FIG. 7 is similar to that illustrated in FIG. 6 with a different being that a third semiconductor element 701, a fifth bonding structure 725, a sixth bonding structure 728, a seventh bonding structure 729, and an eighth bonding structure 730 are further included.

The first semiconductor element 701 may be a die, a chip, a package, or an interposer.

In some embodiments, the fifth bonding structure 725 and the sixth bonding structure 728 are similar to that illustrated in FIG. 2. In some embodiments, the seventh bonding structure 729 and the eighth bonding structure 730 are similar to that illustrated in FIG. 1. In some embodiments, the fifth bonding structure 725 and the sixth bonding structure 728 electrically connect to the first bonding structure 620 and the second bonding structure 621, respectively. In some embodiments, the fifth bonding structure 725 and the sixth bonding structure 728 are disposed adjacent to the seventh bonding structure 729 and the eighth bonding structure 730, respectively. In some embodiments, the fifth bonding structure 725 and the sixth bonding structure 728 electrically connect to the seventh bonding structure 729 and the eighth bonding structure 730, respectively.

In some embodiments where the first bonding structure 620 and the second bonding structure 621 electrically connects the second semiconductor element 603 to the first semiconductor element 602 and the fifth bonding structure 725, the sixth bonding structure 728, the seventh bonding structure 729, and the eighth bonding structure 730 electrically connects the second semiconductor element 603 to the third semiconductor element 701, the second semiconductor element 603 may electrically connect to the third semiconductor element 701 through the first semiconductor element 602. In some embodiments where the fifth bonding structure 725, the sixth bonding structure 728, the seventh bonding structure 729, and the eighth bonding structure 730 electrically connects the second semiconductor element 603 to the third semiconductor element 701, and the third bonding structure 622 and the fourth bonding structure 623 electrically connects to a bump 624a, 624b, the third semiconductor element 701 may electrically connect to another semiconductor element through the first semiconductor element 602.

Figure 8:
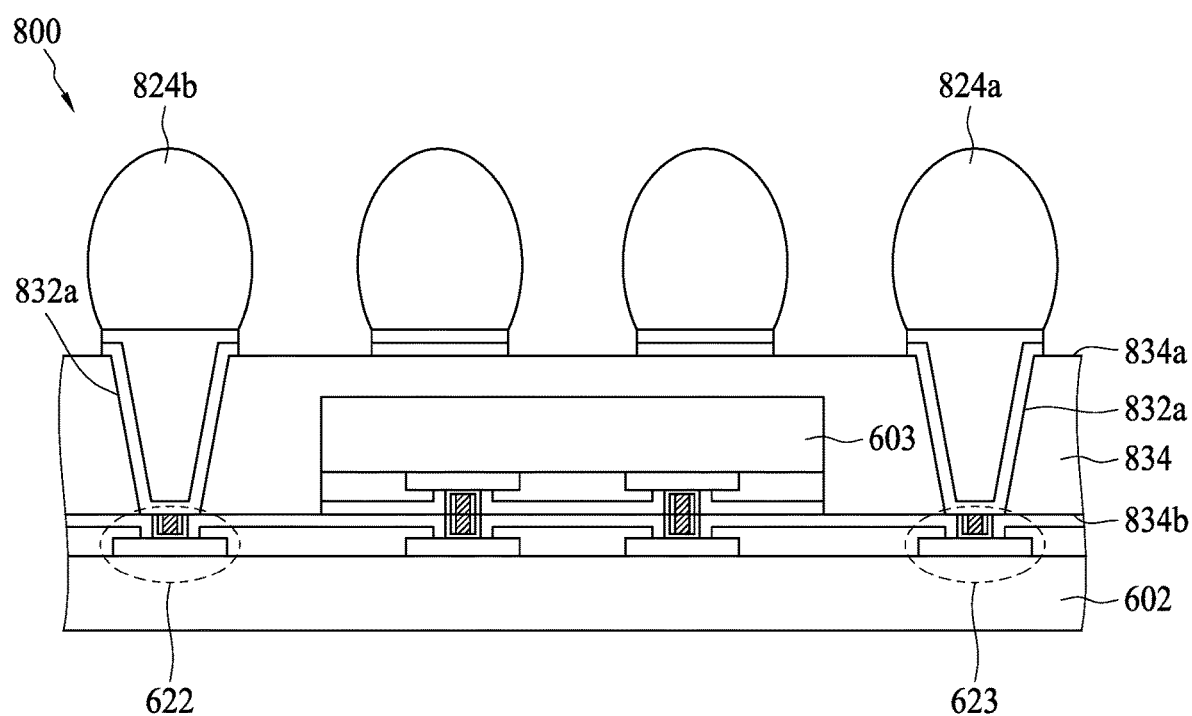
FIG. 8 illustrates a cross-sectional view of a semiconductor device according to an embodiment of the present disclosure.

FIG. 8 illustrates a cross-sectional view of a semiconductor device 800 according to an embodiment of the present disclosure. The semiconductor device 800 of FIG. 8 is similar to that illustrated in FIG. 6 with a different including that the second semiconductor element 603 is encapsulated and at least one conductive via 832a, 832b is disposed in the encapsulant 834 and at least one bump 824a, 824b is disposed adjacent to the top surface 834a of the encapsulant 834.

The conductive via 832a, 832b may extend from the top surface 834a of the encapsulant 834 to the bottom surface 834b thereof. In some embodiments, the conductive vias 832b, 832a electrically connects to the third bonding structure 622 and the fourth bonding structure 623, respectively. In some embodiments, the conductive vias 832a, 832b electrically connects to the bump 824a, 824b, respectively. In some embodiments where the conductive via 832a, 832b electrically connects to the bump 824a, 824b and the conductive via 832b, 832a electrically connects to the third bonding structure 622 and the fourth bonding structure 623, the first semiconductor element 602 may electrically connect to the external environment through the second semiconductor element 834.

FIGS. 9A-9H illustrate a method for manufacturing a semiconductor device such as the semiconductor device 100 of FIG. 1. FIGS. 9A-9J illustrate a method for manufacturing a semiconductor structure such as the semiconductor structure 500 of FIG. 5. FIGS. 9A-9K illustrate a method for manufacturing a semiconductor device such as the semiconductor device 600 of FIG. 6.

Figure 9A:
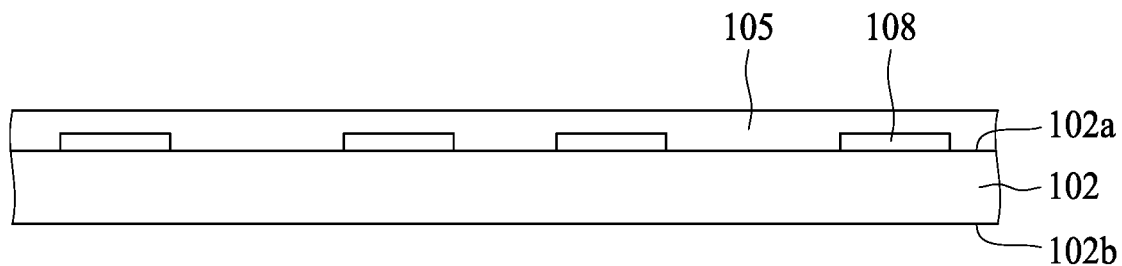
FIG. 9A, FIG. 9B, FIG. 9C, FIG. 9D, FIG. 9E, FIG. 9F, FIG. 9G, and FIG. 9H illustrate a method for manufacturing a semiconductor device such as the semiconductor device of FIG. 1.

Referring to FIG. 9A, a first semiconductor element 102 is provided. The first semiconductor element 102 may be a die, a chip, a package, or an interposer. The first semiconductor element 102 has a first element top surface 102a, a first element bottom surface 102b opposite to the first element top surface 102a, and at least one first bonding pad 108. The first bonding pad 108 is disposed adjacent to the first element top surface 102a of the first semiconductor element 102. The first bonding pad 108 may be, for example, a contact pad of a trace.

A first protective layer 104 is disposed adjacent to the first element top surface 102a of the first semiconductor element 102. In some embodiments, the first protective layer 104 covers the first element top surface 102a of the first semiconductor element 102 and the first bonding pad 108. The first protective layer 104 may be disposed by, for example, a coating technique.

Figure 9B:
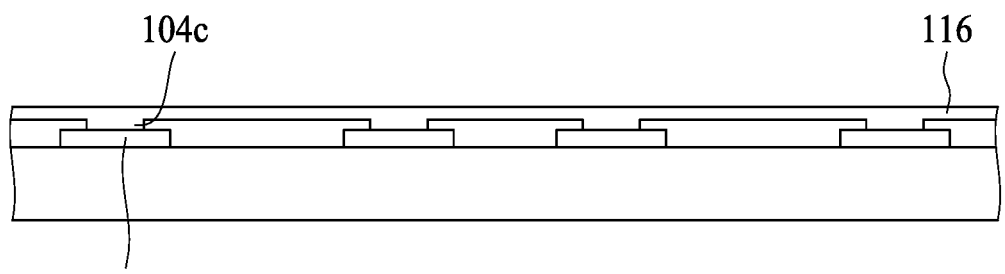

Referring to FIG. 9B, the first protective layer 104 defines at least one opening 104c. Each opening 104c corresponds to a respective first bonding pad 108 and exposes a portion of the first bonding pad 108. In some embodiments, the first protective layer 104 covers a portion of the first bonding pad 108 and a portion of the first element top surface 102a of the semiconductor element 102. The opening 104c can be formed by photolithography, etching, laser drilling, or other suitable processes.

A second insulation layer 116 may be further disposed on the first protective layer 104 and disposed adjacent to the first element top surface 102a of the first semiconductor element 102. The second insulation layer 116 may be disposed by, for example, a coating technique.

Figure 9C:
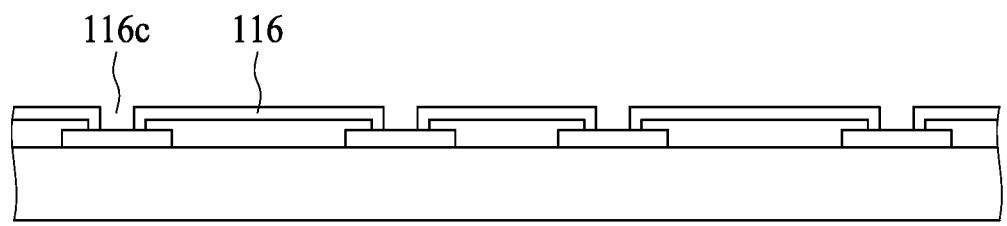

Referring to FIG. 9C, the second insulation layer 116 defines a second opening 116c. Each second opening 116c corresponds to a respective first bonding pad 108 and exposes a portion of the first bonding pad 108. In some embodiments, the second insulation layer 116 covers a portion of the first bonding pad 108 and a portion of first protective layer 104. The second opening 116c can be formed by photolithography, etching, laser drilling, or other suitable processes.

Figure 9D:
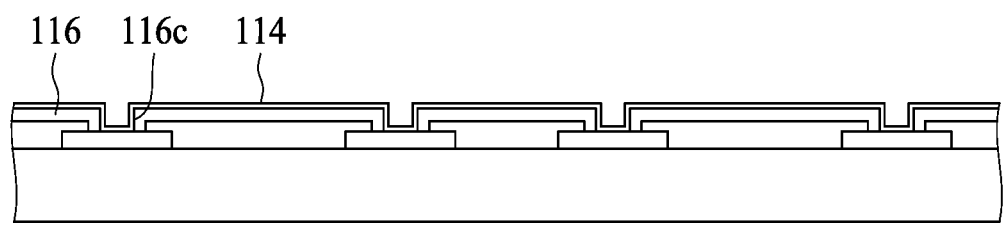

Referring to FIG. 9D, the first metal layer 114 is formed on the second insulation layer 116 and in the second opening 116c. In some embodiments, the first metal layer 114 is formed in conformity with the second insulation layer 116 and the second opening 116c. The first metal layer 114 may be formed, for example, by a physical vapor deposition technique.

Figure 9E:
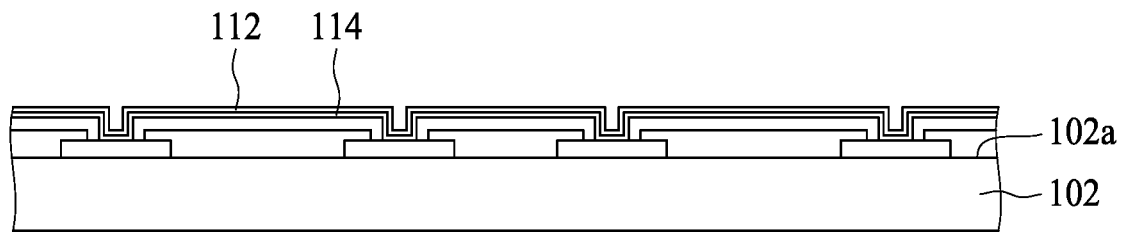

Referring to FIG. 9E, a first insulation layer 112 is disposed on the first metal layer 114 and disposed adjacent to the first element top surface 102a of the first semiconductor element 102. The first insulation layer 112 may be disposed by, for example, a coating technique.

Figure 9F:
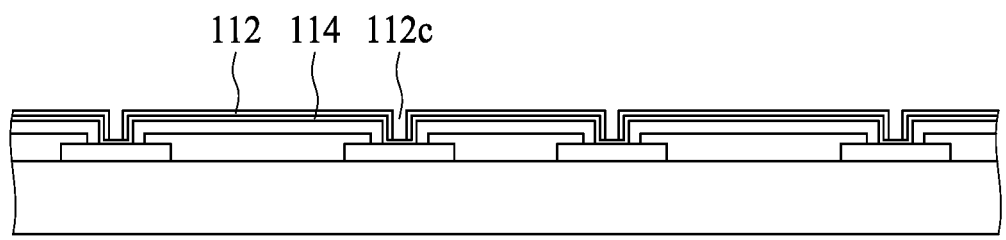

Referring to FIG. 9F, the first insulation layer 112 defines a third opening 112c. Each third opening 112c corresponds to a respective first bonding pad 108 and exposes a portion of the first metal layer 114. The third opening 112c can be formed by photolithography, etching, laser drilling, or other suitable processes.

Figure 9G:
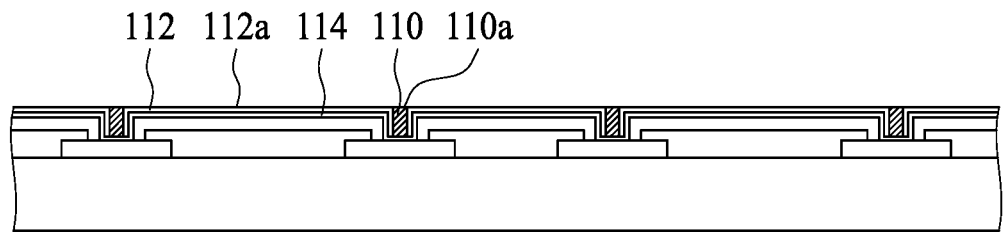

Referring to FIG. 9G, the first electrical connector 110 is formed in the third opening 112c. In some embodiments, the first electrical connector 110 is formed from the exposed portion of the first metal layer 114. The first electrical connector 110 may have a first connector top surface 110a not substantially higher than the first insulation top surface 112a of the first insulation layer 112. In some embodiments, the first electrical connector 110 has a first connector top surface 110a substantially lower than the first insulation top surface 112a of the first insulation layer 112. The first electrical connector 110 can be formed by, for example, a plating technique.

Figure 9H:
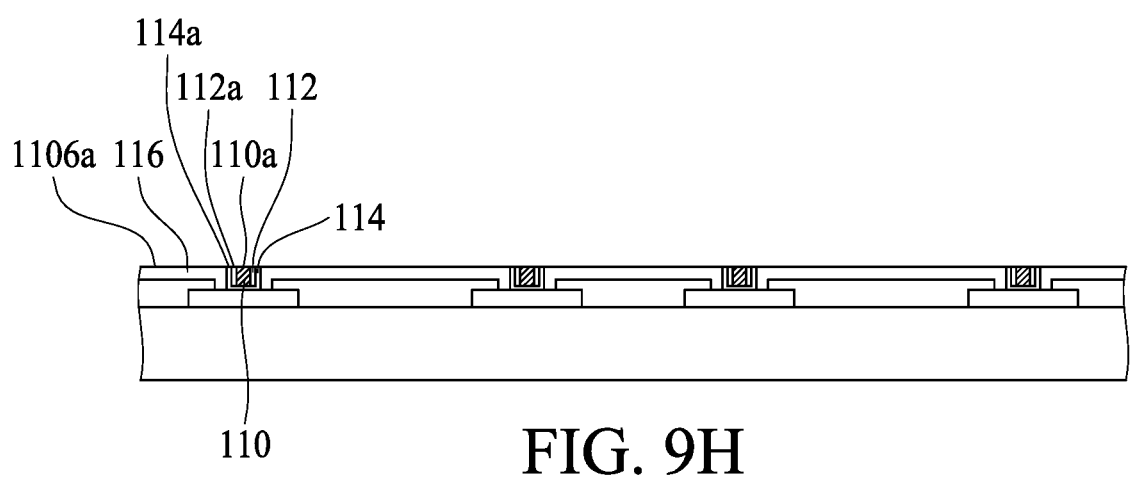

Referring to FIG. 9H, the first insulation layer 112 and the first metal layer 114 are removed to expose the second insulation layer 116. In some embodiments, the second insulation top surface 116a of the second insulation layer 116 is substantially coplanar with the first metal top surface 114a of the first metal layer 114. In some embodiments, the second insulation top surface 116a is substantially coplanar with the first insulation top surface 112a of the first insulation layer 112. In some embodiments, the second insulation top surface 116a is substantially coplanar with the first connector top surface 110a of the first electrical connector 110. In some embodiments, the second insulation top surface 116a of the second insulation layer 116 is substantially coplanar with the first metal top surface 114a, the first insulation top surface 112a, and the first connector top surface 110a. Subsequently, a semiconductor structure (e.g., a semiconductor structure 100 as is illustrated in FIG. 1) can be obtained. The removal can be achieved by, for example, a chemical mechanical polishing (CMP) technique.

Figure 9I:
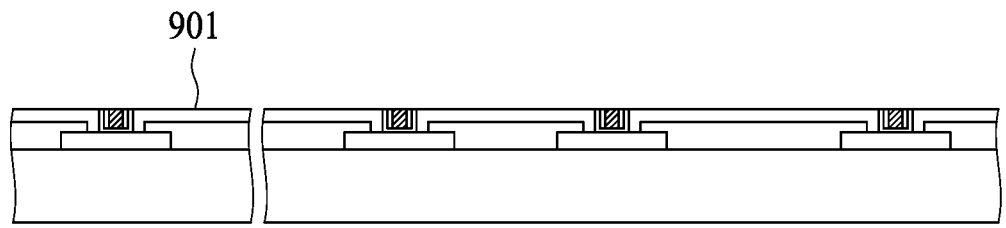

Referring to FIG. 9I, a singulation process (e.g., sawing) is performed to obtain individual semiconductor component units 901.

Figure 9J:
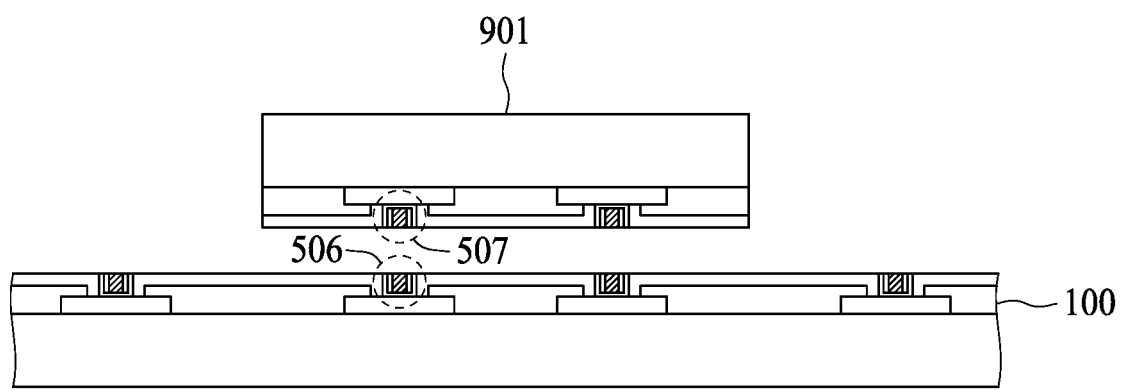

Referring to FIG. 9J, a semiconductor component unit 901 may be bonded to the semiconductor structure 101 by bonding the second bonding structure 507 to the first bonding structure 506. The second bonding structure 507 may bond to the first bonding structure 506 by, for example, a eutectic bonding technique. Subsequently, a semiconductor structure (e.g., a semiconductor structure 500 as is illustrated in FIG. 5) can be obtained.

Figure 9K:
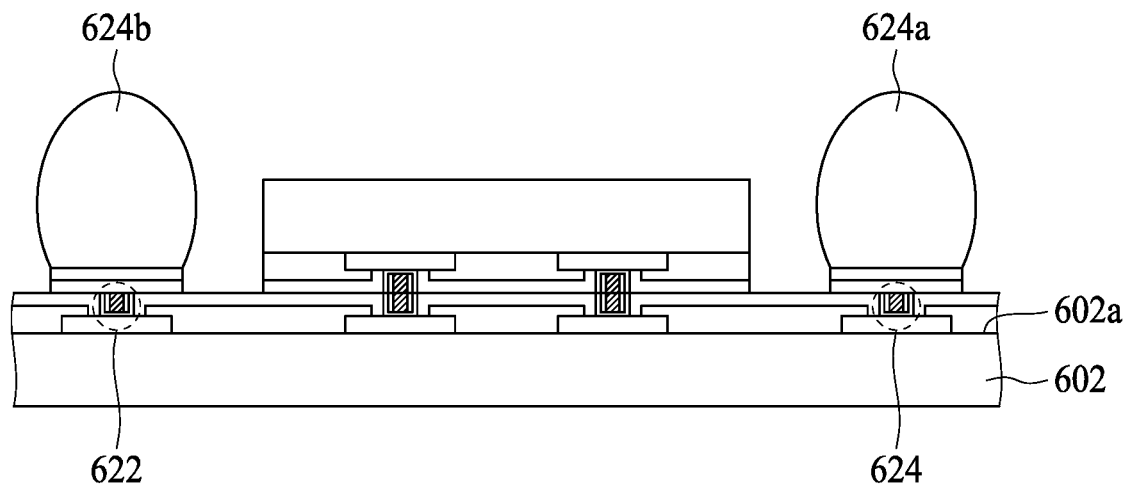

Referring to FIG. 9K, at least one bump 624a, 624b is disposed adjacent to the third bonding structure 622 and the fourth bonding structure 624, respectively. In some embodiments, the bumps 624a, 624b electrically connect to the third bonding structure 622 and the fourth bonding structure 624, respectively for external electrical connection. The bump 624a, 624b may be a pillar or a solder/stud bump. The bump 624a, 624b may be formed by a combination of a physical vapor deposition, plating, photolithography, etching, solder reflowing, or other suitable processes. Subsequently, a semiconductor device (e.g., a semiconductor device 600 as is illustrated in FIG. 6) can be obtained.

As used herein and not otherwise defined, the terms "substantially" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a line or a plane can be substantially flat if a peak or depression of the line or plane is no greater than 5 no greater than 1 or no greater than 0.5 Two surfaces can be deemed to be coplanar or substantially coplanar if a displacement between the two surfaces is no greater than 5 μm, no greater than 1 μm, or no greater than 0.5 μm.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor bonding structure, comprising:
   a first semiconductor element having a first element top surface and a first element bottom surface opposite to the first element top surface;
   a first bonding structure disposed adjacent to the first element top surface of the first semiconductor element, comprising:
      a first electrical connector;
      a first insulation layer surrounding the first electrical connector; and
      a first metal layer surrounding the first insulation layer; and
   a second electrical connector disposed in the first semiconductor element, wherein the second electrical connector electrically connects to the first bonding structure.

2. The semiconductor bonding structure of claim 1, further comprising a first protective layer disposed adjacent to the first element top surface of the first semiconductor element, wherein the first protective layer defines a first opening accommodating the first bonding structure.

3. The semiconductor bonding structure of claim 2, further comprising a second insulation layer disposed on the first protective layer, wherein the second insulation layer defines a second opening accommodating the first bonding structure.

4. The semiconductor bonding structure of claim 3, wherein the second insulation layer has a second insulation top surface and a second insulation bottom surface and the first insulation layer has a first insulation top surface and a first insulation bottom surface, wherein the second insulation top surface of the second insulation layer is substantially coplanar with the first insulation top surface of the first insulation layer.

5. The semiconductor bonding structure of claim 1, further comprising a first bonding pad disposed adjacent to the first element top surface of the first semiconductor element, wherein the second electrical connector electrically connects to the first bonding pad and the first bonding pad electrically connects to the first bonding structure.

6. The semiconductor bonding structure of claim 5, further comprising a second bonding pad disposed adjacent to the first element bottom surface of the first semiconductor element, wherein the second bonding pad electrically connects to the second electrical connector.

7. The semiconductor bonding structure of claim 1, further comprising a second insulation layer surrounding the second electrical connector and a second metal layer surrounding the second insulation layer.

8. A semiconductor bonding structure, comprising:
   a first semiconductor element having a first element top surface and a first element bottom surface opposite to the first element top surface;
   a first bonding structure disposed in the first semiconductor element, comprising:
      a first electrical connector;
      a first insulation layer surrounding the first electrical connector; and
      a first metal layer surrounding the first insulation layer; and
   a second insulation layer surrounding the first metal layer.

9. The semiconductor bonding structure of claim 8, wherein the first bonding structure extends from the first element top surface of the first semiconductor element to the first element bottom surface of the first semiconductor element.

10. The semiconductor bonding structure of claim 8, further comprising a first bonding pad disposed adjacent to the first element top surface of the first semiconductor element, wherein the first bonding pad electrically connects to the first bonding structure.

11. The semiconductor bonding structure of claim 10, further comprising a second bonding pad disposed adjacent to the first element bottom surface of the first semiconductor element, wherein the second bonding pad electrically connects to the first bonding structure.

12. The semiconductor bonding structure of claim 8, wherein the second insulation layer has a second insulation top surface and a second insulation bottom surface and the first insulation layer has a first insulation top surface and a first insulation bottom surface, wherein the second insulation bottom surface is substantially coplanar with the first insulation bottom surface.

13. The semiconductor bonding structure of claim 8, further comprising:
   a second bonding structure disposed adjacent to the first element top surface or the first element bottom surface of the first semiconductor element, wherein the second bonding structure electrically connects to the first bonding structure.

14. The semiconductor bonding structure of claim 13, wherein the second bonding structure comprises:
   a second electrical connector;
   a third insulation layer surrounding the second electrical connector; and
   a second metal layer surrounding the third insulation layer.

15. The semiconductor bonding structure of claim 14, wherein the second metal layer has a side surface under a projection area of the first electrical connector.

16. A method of manufacturing a semiconductor bonding structure, comprising:
   providing a semiconductor element having an element top surface and an element bottom surface opposite to the element top surface, the semiconductor element including at least one first bonding pad disposed adjacent to the element top surface;
   disposing an outer insulation layer adjacent to the element top surface of the semiconductor element, wherein the outer insulation layer defines a first opening exposing a portion of the first bonding pad;
   disposing a metal layer in the first opening, wherein the metal layer defines a second opening;

disposing an inner insulation layer in the second opening, wherein the inner insulation layer defines a third opening;

disposing an electrical connector in the third opening;

disposing a middle insulation layer on the outer insulation layer and the metal layer is disposed on the middle insulation layer; and removing a portion of the inner insulation layer and a portion of the metal layer to expose the middle insulation layer after disposing the electrical connector.

* * * * *